United States Patent
Wong et al.

(10) Patent No.: US 7,404,172 B2
(45) Date of Patent: Jul. 22, 2008

(54) METHOD FOR THE SYNTHESIS OF VLSI SYSTEMS BASED ON DATA-DRIVEN DECOMPOSITION

(75) Inventors: Catherine G. Wong, Pasadena, CA (US); Mika Nystroem, Pasadena, CA (US); Alain J. Martin, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 457 days.

(21) Appl. No.: 10/741,839

(22) Filed: Dec. 19, 2003

(65) Prior Publication Data
US 2004/0158802 A1    Aug. 12, 2004

Related U.S. Application Data

(60) Provisional application No. 60/435,502, filed on Dec. 19, 2002.

(51) Int. Cl.
*G06F 17/50* (2006.01)
(52) U.S. Cl. .................................. 716/18; 716/3; 716/7
(58) Field of Classification Search ................ 716/2–7, 716/18; 717/154, 160, 161
See application file for complete search history.

(56) References Cited

U.S. PATENT DOCUMENTS

| | | | | |
|---|---|---|---|---|
| 5,293,631 | A * | 3/1994 | Rau et al. | 717/154 |
| 6,438,747 | B1 * | 8/2002 | Schreiber et al. | 717/160 |
| 6,507,947 | B1 * | 1/2003 | Schreiber et al. | 717/160 |
| 6,651,247 | B1 * | 11/2003 | Srinivasan | 717/161 |

OTHER PUBLICATIONS

Shafiaabadi, M. H. et al., New Methods to Reduce Energy and Area in Asynchronous Circuits Following the Decomposition Stage, Department of Computer Eng. and IT, Amirkarbir University of Technology, 2004.*
Wong, C. G. et al., Data-Driven Process Decomposition for Circuit Synthesis, vol. 1, p. 539-546, ICECS 2001.*

* cited by examiner

*Primary Examiner*—Stacy A Whitmore
(74) *Attorney, Agent, or Firm*—J. D. Harriman, II; DLA Piper US LLP

(57) ABSTRACT

The present invention is a systematic and data-driven-decomposition (DDD) method and apparatus for use in VLSI synthesis. The invention decomposes a high level program circuit description into a collection of small and highly concurrent modules that can be implemented directly into transistor networks. This enables an automatic implementation of a decomposition process currently done by hand. Unlike prior art syntax-based decompositions, the method of the present invention examines data dependencies in the process' computation, and then attempts to eliminate unnecessary synchronization in the system. In one embodiment, the method comprises: a conversion to convert the input program into an intermediate Dynamic Single Assignment (DSA) form, a projection process to decompose the intermediate DSA into smaller concurrent processes, and a clustering process that optimally groups small concurrent processes to make up the final decomposition. Another embodiment is a decomposition, projection, and clustering tool implemented in computer program codes.

51 Claims, 12 Drawing Sheets

METHOD FOR THE SYNTHESIS OF VLSI SYSTEMS BASED ON DATA-DRIVEN DECOMPOSITION

This application claims the benefit of U.S. Provisional Patent Application No. 60/435,502, filed on Dec. 19, 2002, the disclosure of which is hereby incorporated by reference.

The invention was made by an agency of the United States Government or under a contract with an agency of the United States Government. The name of the U.S. Government agency is DARPA and the Government contract number F29601-00K-0184.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

1. Field of the Invention

The present invention relates to the field of VLSI (Very Large Scale Integration) circuit design, and in particular to a method for VLSI synthesis based on data-driven decomposition (DDD).

2. Background Art

Asynchronous VLSI is heralded for its robustness, low power, and fast average-case performance. Many chip designers, however, are deterred from taking advantage of these qualities by the lack of a straightforward design approach.

In designing asynchronous VLSI systems, the formal synthesis of asynchronous VLSI systems begins with a sequential description of the circuit specification and results in a complex and highly concurrent network of transistors. This is accomplished through the application of a series of transformations that preserve the semantics of the program.

One synthesis method begins by describing circuits using a high-level language, Communicating Hardware Processes (CHP). Successive semantics-preserving program transformations are then applied, each generating a lower-level description of the circuit. The final output is a transistor netlist. This method is correct by construction, and every chip designed using this approach (including a 2M-transistor asynchronous MIPS R3000 microprocessor) has been functional on first silicon. However, until recently, the transformations have all been applied by hand, with heavy dependence upon simulations at every level.

Syntax-Directed Decomposition

Within the series of transformations performed on the CHP, the most difficult transformation is the first step, process decomposition. This step is also one with a large effect on the speed and energy efficiency of the final system. In process decomposition, the original sequential CHP description of the circuit is broken up (decomposed) into a system of communicating modules (still expressed in CHP) that are then individually synthesized at lower levels. The inter-module communications mapped out during this step consume the bulk of energy in the finished asynchronous system, as data must be not only sent, but also validated and acknowledged.

After decomposition, the synthesis steps that follow compile the concurrent system into successively lower-level descriptions, with the final system being expressed as a network of transistors. Therefore, keeping the decomposition target processes simple makes the rest of the synthesis steps feasible.

Currently, designers rely greatly on experience and intuition to create an energy-efficient system. Existing formal methods of decomposition in the synthesis of asynchronous circuits are purely syntax-directed. As such, they decompose a process into a set of basic processes, each of which corresponds to a syntactic construct in the source language. Although CAD tools exist for process decomposition, they are mostly syntax-directed, or they begin with a lower-level specification than CHP. For example, the designers of the asynchronous MIPS R3000 saw that very fine-grained pipeline stages were required to achieve high throughput, and abandoned the syntax-directed approach because it could not generate modules that were small enough.

What is desired is a new method of decomposition that can formalize the ad-hoc decomposition while maintaining results close to those obtained by hand in the current state of art. Such a method would decompose a high level program description of a circuit into a collection of small and highly concurrent modules that can be implemented directly into transistor networks, all without requiring the laborious, and often unsuccessful, trial-and-error iterations of the informal manual approach.

SUMMARY OF THE INVENTION

The present invention relates to the field of VLSI circuit design, and in particular to a method for VLSI synthesis based on data-driven decomposition (DDD).

One embodiment of the present invention is a systematic and data-driven decomposition method to decompose a high level program description of a circuit into a collection of small and highly concurrent modules that can be implemented directly into transistor networks. The formalized method enables an automatic implementation of a decomposition process currently done by hand. Since the method stays at the level of the source program, it is entirely general and has applications beyond the scope of asynchronous design.

Instead of being dictated by the syntax of the input program, the decomposition method of the present invention examines data dependencies in the process' computation, and then attempts to eliminate unnecessary synchronization in the system. Depending on the flow of data in the original process, concurrency may be added into the system through decomposition. To avoid dealing with mutual exclusion problems, no shared variables or communication channels are permitted. The decomposed processes transfer data by explicitly communicating with each other.

Data Driven Decomposition (DDD) Process

FIG. 1A shows one embodiment of the present invention, comprising the following: a conversion to convert the input program in CHP into an intermediate Dynamic Single Assignment (DSA) form (2), a projection process to decompose the intermediate DSA into smaller concurrent processes (4), and a clustering process that optimally groups small concurrent processes to make up the final decomposition (6).

DSA conversion involves transforming the input program into a form wherein no variable is assigned a value more than once during execution. Multiple assignments to the variable may appear in the process code (for example, in different branches of a selection), but only one will actually be executed during each iteration of the process's outer loop. The identity of this assignment is not known until runtime.

The overall decomposition approach specifies that each target process consist of all of the assignments that occur in the source process to a particular variable. Converting the source process into DSA form can reduce the number of assignments to a variable and hence simplify the target processes of a decomposition. Since simple target processes make the post-decomposition steps of synthesis easier, one thing that the DSA conversion does is to take variables with multiple assignments in the source process and split them to create new DSA variables.

These DSA variables are then projected onto their own target processes in the projection step (step 4 of FIG. 1A). The decomposition method of the present invention directs the contents of the projection sets by specifying that each set should contain the variables and channels required to implement the assignments to a particular DSA variable. This is a different approach then the one done in the past, where designers have relied on experience and intuition in choosing which variables belong in what projection set.

The correctness of projection has been proven under the assumption of slack elasticity. In the current state of the art, projection has been used to verify the equivalence between source processes and systems that have been decomposed informally by hand. However, up till now, there has been no effective and general application of projection in creating process decompositions. The present invention thus transforms projection from a verification tool to a decomposition tool.

Because of the constrcut of rewriting the program in the DSA form, the projection of present invention can find the decomposed solution ahead of time. Graphical decomposition follows from the DSA form—if each new process computes a value for a single variable, then the data dependency graph that the variables create provides an overall view of the final decomposed system. The edges in the graph indicate the new intermediate channels required for decomposition and, by their presence, also imply the existence of new copies of variables. With such guidelines, a shorthand form of projection can be directly applied to the program without rewriting any lines of code. In short, the variable and edges of each point node comprise a separate projection set from the main program.

Thus, instead of the prior art methods of relying on experience and intuition in choosing which variables belong in what projection set, the decomposition method of the present invention directs the contents of the projection sets by specifying that each set should contain the variables and channels required to implement the assignments to a particular DSA variable.

In the present invention, the projection set of a variable x contains: (1) the variables and input channels on whose value the assignment to x depends; (2) the output channels on which x is sent; (3) the intermediate channels created by decomposition for communication between the new target processes.

DSA conversion and projection are illustrated in FIG. 1B. By controlling the contents of each projection set, each DSA variable is isolated into its own target process.

As a simple example, consider the following process:

$P \equiv *[A?a, B?b, C?c; x:=f(a,b), Y!g(b,c)]$ (The notation used to specify the behaviour of circuits illustrated in the present invention is CHP, a variant of CSP designed for communicating hardware processes.)

After decomposition, the process becomes:

$P \equiv CPb \| Px \| PY$ $CPb \equiv *[B?b; B_x!b, B_Y!b]$ $Px \equiv *[A?a, B_x?b; x:=f(a,b)]$ $PY \equiv *[B_y?b, C?c; Y!g(b,c)]$ P is decomposed into an equivalent system that contains target processes for the assignments to variable x and to output channel Y. The resultant system is illustrated in FIG. 1C The processes in a decomposed system produced by the process of DSA conversion and projection are slated for clustering. Recomposing DDD modules into larger modules further improves energy and performance. DDD modules can be clustered together with different goals in mind: reducing energy consumption, reducing forward latency, or reducing the time and energy-efficiency metric $Et^2$. An example of clustering optimization is illustrated in FIG. 5, where graph 60 shows a system before clustering and graph 62 shows the equivalent system after clustering.

Clustering is implemented in two stages. In the first stage, DDD modules along the critical path of a system are repeatedly clustered in series until they are too large to be implemented as single PCHB stages. The second stage requires a global optimization algorithm (e.g. quadratic programming, simulated annealing, and genetic algorithms) to both cluster DDD modules in parallel and add slack-matching buffers to improve performance.

Another embodiment of the present invention is a DDD decomposition and projection algorithm implemented in computer program codes in a computer storage media. Another embodiment of the present invention is a clustering tool implemented in computer program codes in a computer storage media. The clustering tool receives as its input a concurrent system of DDD modules, as well as physical limits and desired cycle time of PCHB buffer stages. The output of the clustering tool is a coarser-grained concurrent system of modules that can still each be implemented as a single asynchronous pipeline stage.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The present invention relates to the field of VLSI circuit design, and in particular to a method for VLSI synthesis based on data-driven decomposition (DDD). Embodiments of the present invention comprise of methods that aid the design of VLSI circuit by formalizing and automating decomposition based on data dependencies.

In the present invention, the basic units of decomposition are assignments to a variable (whether through a communication with another process or an actual assignment statement). The goal is to give every variable in the source process its own target process that implements all assignments to that variable. These target processes mostly conform to a basic template. To keep the target processes simple enough for future synthesis, the decomposition method must control the number of assignments to each variable in the source process.

One decomposition method embodiment is comprised of three stages. First, the source process is converted into Dynamic Single Assignment (DSA) form. Then, the process is projected onto disjoint sets of its variables and communication channels. This projection results in a system of new, small, communicating target processes. Finally, clustering is performed to optimally group smaller processes together to form the final output.

In the following sections, the three stages are described in order, along with the implementation of an algorithm embodiment of DDD in a computer storage media.

1 DSA Conversion Requirements

In converting to DSA form, certain fine-tuning must be performed on the input program. For an CHP input program P as input, the following restrictions are placed on P:

- It is non-terminating. Instead of executing its statements only once, the program is enclosed within a main, unconditional loop.
- All statements are contained within main loop. Initial actions that occur before the main loop must be removed and handled through processes separate from the main program.
- A variable is assigned in the same loop iteration that it is used. State variables must be removed and handled through processes separate from the main program.
- There are no arrays. Array structures must be extracted into their own process, leaving only independent variables in the main program.
- All variables have only one assignment statement during the loop. Variables that are assigned a value more than once during a main loop iteration must be split into multiple single-assignment variables.

Figure 1A:
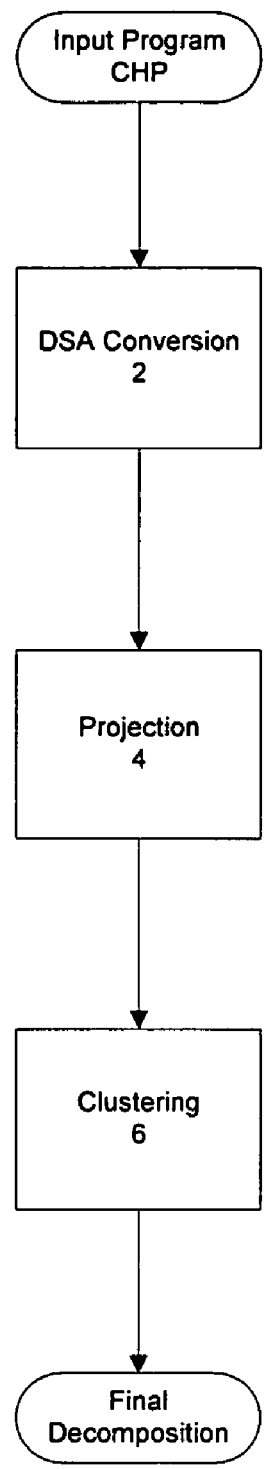
FIG. 1A outlines the data-driven decomposition (DDD) process according to an embodiment of the present invention.
Figure 1B:
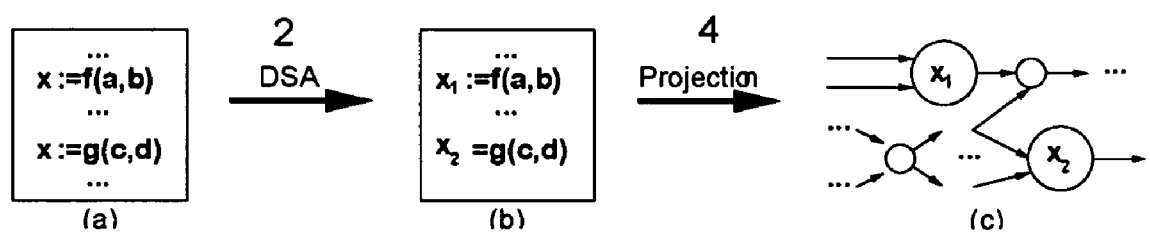
FIG. 1B illustrates the process of DSA conversion and the projection process according to an embodiment of the present invention.
Figure 1C:
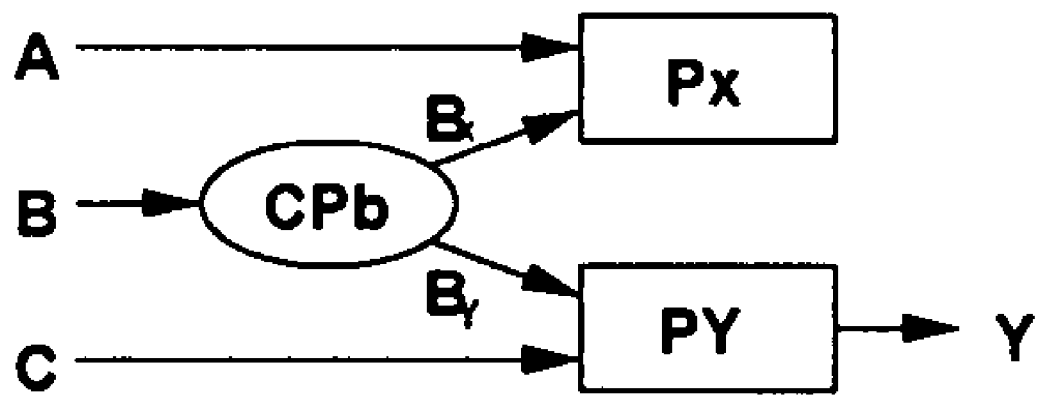
FIG. 1C shows an example result of projection.
Figure 2:
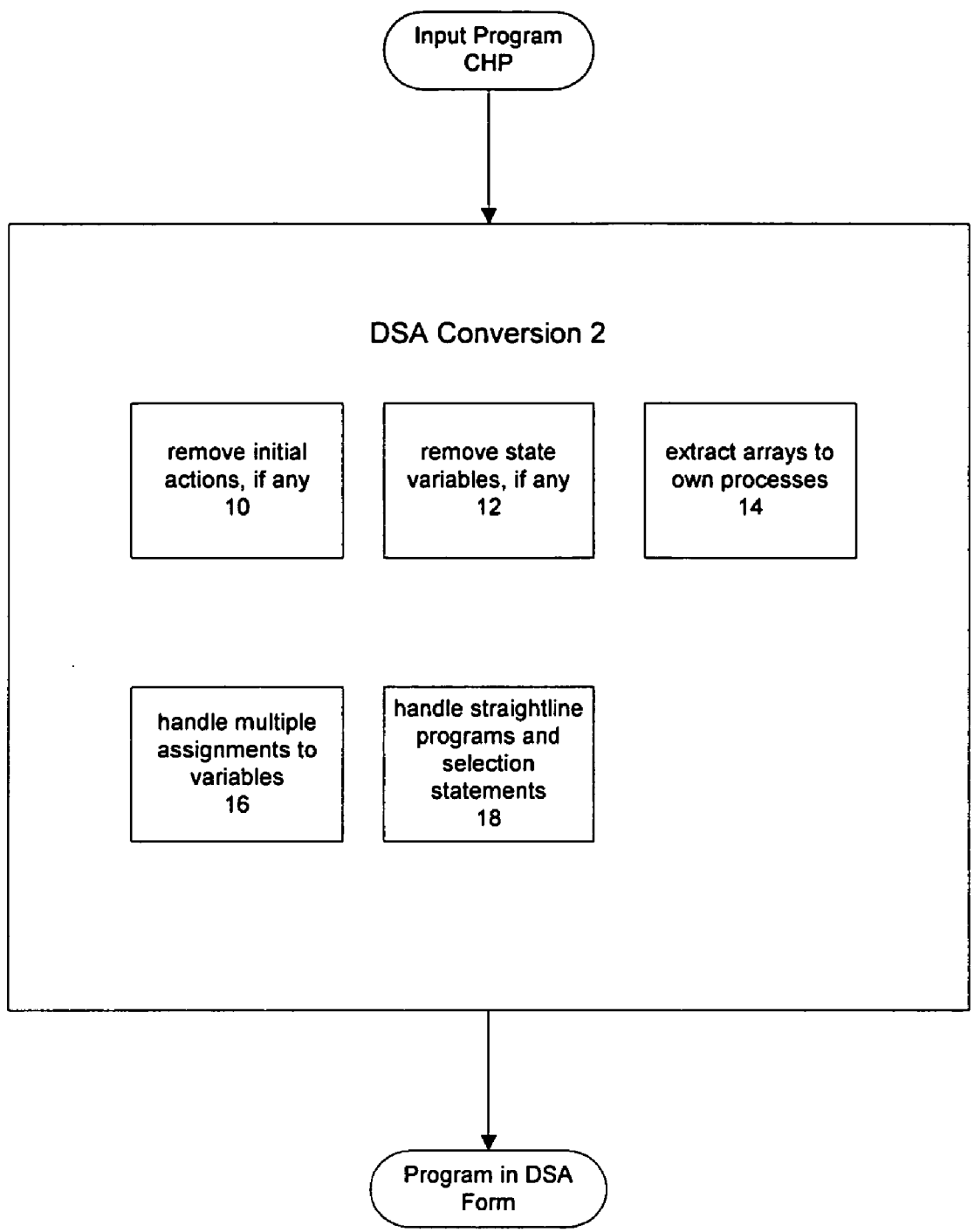
FIG. 2 outlines the DSA conversion process according to an embodiment of the present invention.

Thus, several streamlining steps must be performed to conform the input programs to these four requirements. FIG. 2 outlines the action steps within DSA conversion 2. These action steps need not be performed in any particular order. In steps 10 and 12, initial actions and state variables, if found, are extracted from the main program and given their own processes. Also, arrays are extracted into their own processes in step 14. The process finds variables that have multiple assignments, and perform actions to ensure that such variables are only assigned once (step 16). Straightline programs and selection statements (the main part of the input program) are handled in step 18. As such, each action handles a particular component one may encounter in an input program. Each action that is performed in the conversion of the input program into DSA is outlined below.

1.1 Initial Actions

Initial actions are channel outputs or variable assignments that occur before the main loop of the program begins. In the program below, both the output on X and the assignment to y are initial actions.

$$X!x\_init, y\downarrow;$$
$$*[ A?a;$$
$$[ a \wedge y \rightarrow Y?y$$
$$[] \neg a \vee \neg y \rightarrow X!f(a, y); Y?y$$
$$]]$$

To separate the initial actions from the main loop, buffer processes that are initialised with a token are created. The buffer for X is now placed between the output of the main loop and the environment. Meanwhile, the buffer for y reads in the current value of the variable and then writes it back to the next iteration of the main loop. In the rewritten program below, all statements in the main process are contained in the main loop.

$$Y_{curr}!false; *[ Y_{next}?y; Y_{curr}!y ]$$
$$|| X!x\_init; *[ X_{out}?x; X!x ]$$
$$|| *[ A?a, Y_{curr}?y;$$
$$[ a \wedge y \rightarrow Y?y$$
$$[] \neg a \vee \neg y \rightarrow X_{out}!f(a, y); Y?y$$
$$]; Y_{next}!y$$
$$]$$

1.1.1 State Variables

State variables are variables that are not always explicitly given a value during a main loop iteration before being used in that iteration. When the program is encapsulated in a single process, the value of the variable is implicitly remembered between iterations. However, when the program is decomposed, the value must be explicitly remembered and communicated between processes. To prepare for decomposition, then, the program must be rewritten to remove the state variables.

In the following program, if a is false then b is not given a new value for the iteration.

Thus b is a state variable.

$$*[ A?a; [ a \rightarrow B?b [] \neg a \rightarrow skip ]; X!f(a, b) ]$$

To remove a state variable from a program, a buffer process that will receive the value at the end of one iteration and send that value to the beginning of the next iteration is created. (This new process is similar to that created when initial assignments are extracted from the mainline program. In this case however, the initial value sent by the buffer is not used by the main process.) The rewritten program is as follows:

```
B_curr!junk; *[ B_next?b; B_curr!b ]
|| *[ A?a, B_curr?b;
     [ a → B?b
     [] ¬a → skip
     ]; X!f(a, b), B_next!b
   ]
```

If it is only on rare loop iterations that a state variable is not given a value, then sending the value through the buffer after every iteration can seem expensive. In such cases, adding complexity to change the state variable process from a simple buffer to a process with conditional inputs and outputs may be worthwhile. If a variable is assigned a value often enough, the reduction in the number of communications may balance out the more complicated new process in the eyes of the designer.

Finally, if a variable is only conditionally assigned a value during an iteration and is also conditionally used, it may not be a state variable. For example, in the following program, b is not a state variable.

```
*[ A?a; [ a → B?b; X!f(a, b) [] ¬a → skip ] ]
```

Although their data must usually be remembered between loop iterations, arrays are not state variables. They will be handled separately in the next section.

1.2 Arrays

Another action that may need to be performed in the conversion to DSA is the isolation of arrays in the input program (step 14 of FIG. 2). The decomposition algorithm of the present invention does not allow for shared memory between individual processes in the system. All of the variables accessed by a process must be either explicitly input or computed within the process. Hence, arrays in the program must be given special consideration, because the index of the element to be used in an array is usually only determined during computation. The decomposition algorithm therefore cannot know ahead of time which array value a process needs to access, and communication channels cannot be established.

One embodiment of the present invention handles arrays by isolating them into their own CHP processes. When given a specific index, this process can read values from and assign values to the array. In this case, only array indices and single elements of data need to be communicated across a channel, and never entire arrays.

Implementing this method involves rewriting the original CHP process by explicitly assigning certain expressions to their own variables. The following expressions are to be given their own variables:

Array Indices. An array index is to be sent on a channel from the main process to an array process. If the index is not already a single variable, the computation of its value should be encapsulated in a separate process during decomposition. Explicitly assigning the index expression to a new variable allows the decomposition algorithm to extract this computation automatically. As an example, the code $$y := A[x_1], Z?B[x_2+x_3]$$

is rewritten to be $$y := A[x_1], bx := x_2+x_3; Z?B[bx]$$

Array Values in Larger Expressions. If an assignment or output expression is comprised solely of an array value in the form A[x], no new variable is required. However, if the array value forms only one part in a larger expression, this value must be given its own variable. Thus, the main process has an explicit placeholder to receive the value when it is transmitted from the array process. To illustrate, the code $$y := A[x_1], Z!B[x_2]$$

remains the same, but the code $$y := A[x_1]+2, Z!f(B[x_2], C[x_3])$$

is rewritten as follows:

$$ax := A[x_1], bx := B[x_2], cx := C[x_3];$$

$$y := ax+2, Z!f(bx, cx)$$

Array Values Assigned to Other Array Values. If a single array value is assigned to another array value, an intermediate variable should be used to simplify the eventual isolation of arrays into their own processes. For example, $$A[x_1] := B[x_2]$$

becomes $$data := B[x_2]; A[x_1] := data$$

Reconsider the program $P_{array}$ which has three arrays A, B, and C. Explicitly assign new variables for the scenarios listed above. The updated code now becomes

```
*[ I?i, S?s, T?t;
   [ i.op1 → idx := s + t; a := A[idx], b := B[s];
              X!f(a, b), C[t] := const
   [] i.op2 → idx := t + 2; c := C[idx]; A[s] := c
   [] i.op3 → c1 := C[s], c2 := C[t]; idx := c1 + c2;
              b := B[idx]; A[s] := b
   [] i.op4 → b := B[t]; idx := s + B[t];
              c := C[t]; A[idx] := c
   [] i.op5 → B[s] := const
   ]]
```

Once this is done, it is time to abstract the array and isolate it in its own process. Every array process requires a channel on which it inputs the index of the desired access, channels on which it can output the results of an array read and input the values for an array write. The variables that appear in the conditions of these reads and writes must also be sent to the new array process. In short, the array structure is extracted, and the variables that determine the conditions of array access are copied into the new process.

First consider array A. Depending on the value of i, some element in A is either assigned a value (write), or is assigned to another variable (read). Only one of these actions will take place during the loop iteration. The process representing A therefore requires a channel to receive the condition variable i, a channel to receive the array index of the desired action, a channel rdA on which an array value can be output, and a channel wrA on which an array value can be input. The process for A appears below.

```
arrayA ≡ *[ aI?i;
        [ i.op1 → idxA?idx; rdA!A[idx]
        [] i.op2 ∨ i.op3 ∨ i.op4 → idxA?idx; wrA?A[idx]
        [] i.op5 → skip
        ]]
```

Similarly, array B only ever performs a single read action or a single write action during a loop iteration. The CHP code representing this array now reads:

```
arrayB ≡ *[ bI?i;
        [ i.op1 ∨ i.op3 ∨ i.op4 → idxB?idx; rdB!B[idx]
        [] i.op5 → idxB?idx; wrB?B[idx]
        [] i.op2 → skip
        ]]
```

In some cases, two read actions are performed on array C during the same loop iteration. In addition to the standard condition and write channels then, the process representing C requires two outgoing data channels, and two incoming index channels.

```
arrayC ≡ *[ cI?i;
        [ i.op2 ∨ i.op4 → idxC1?idx1; rdC1!C[idx1]
        [] i.op3 → idxC1?idx1, idxC2?idx2;
                   rdC1!C[idx1], rdC2!C[idx2]
        [] i.op1 → idxC1?idx1; wrC?C[idx1]
        [] i.op5 → skip
        ]]
```

Now the three array processes have been extracted. While new communication actions have been added to the remaining program, only single index or data values are ever transmitted on these channels, and never entire arrays. Because all of the actual array operations are handled in a single process for each array, no shared variables are required. Here is the updated main program:

```
main ≡ *[ I?i, S?s, T?t; aI!i, bI!i, cI!i;
        [ i.op1 →  idx := s + t; idxA!idx, idxB!s, idxC!t;
                   rdA?a, rdB?b; X!f(a, b), wrC?const;
        [] i.op2 →  idx := t + 2; idxA!s, idxC!idx;
                   rdC?c; wrA!c
        [] i.op3 →  idxC1!s, idxC2!t; rdC1?c1, rdC2?c2;
                   idx := c1 + c2; idxB!idx, idxA!s;
                   rdB?b; wrA!a
        [] i.op4 →  idxB!t; rdB?b; idx := s + b;
                   idxC!t, idxA!idx, rdC?c; wrA!c
        [] i.op5 →  idxB!s; wrB!const
        ]]
```

1.3 Variables Splitting

When converting a process into DSA form, variables with multiple assignments need to be split into new variables that can be assigned at most one value during execution (step 16 of FIG. 2). Splitting a variable involves associating an index number with each appearance of the variable in the original process.

More specifically, the assignment of index number occurs: (1) when a variable is the input or assignment statement at which it is defined, (2) when it is in the output statement of an output channel. In the case where the variable is within a selection structure, only the actual assignment statement itself and the guard conditions that point to it would receive an index assignment. Any guard conditions that do not point to an assignment statement for the variable in question are lumped together into an else condition that points to a skip command.

Thus, if a process has N assignments to variable x, the converted process can assign these values to separate new variables $x_1, x_2, \ldots, x_N$, in that order. Of course, all references to the variable x in between assignments must be changed as well.

Regular assignments have the general form $x:=f(a, b, \ldots)$, where x, a, and b are variables. In the present decomposition method, every regular assignment (or set of assignments to a variable that occur in different branches of a selection) is projected out into its own target process. Communication statements are also considered to be assignments: A?a assigns the value on the input channel A to variable a, while $X!f(a, b, \ldots)$ assigns a value of function f to the output channel X.

In programs where variables receive have multiple assignments, creating new variables simplifies decomposition. If every instance of a variable between is split into a distinct new variable, the program itself remains functionally unchanged. Consider the following CHP:

```
*[ A?a, B?b, C?c; X!a;
   [ b → a := f(a, b); Y!a
   [] ¬b → Y!c, Z!a
   ]]
```

The variable a appear twice: the first as an unconditional input, while the second as a conditional assignment. Thus, two new variables $a_1$ and $a_2$ are created. When the code is rewritten as follows, the functionality of the program remains the same:

```
*[ A?a₁, B?b, C?c; X!a₁;
   [ b → a₂ := f(a₁, b); Y!a₂
   []   b → Y!c, Z!a₁
   ]]
```

As long as they appear in different guarded commands of a single selection structure, a variable can be counted once and no rewrite is necessary. When a statement that gives a value to a variable is located in a guarded command, it does not affect the code in any other guarded commands. For example, although c is given a value in two different statements in the code below, since they both occur in different guards of the same selection structure, they add up to only one value point. Therefore no extra variables need to be created.

```
*[ A?a, B?b; [ b → C?c [] ¬b → c := a ]; X!c ]
```

1.4 Straightline Programs

In step 18 of FIG. 2, the main input program is converted into DSA form. A commonly found program structure is straightline assignments. When multiple assignments to a variable x appear in a series of statements with no branches of control, x can easily be split into new variables with a single assignment each. (Since there is only a single branch of control, every assignment that appears in an unconditional series is guaranteed to be executed.) Consider a general straightline series of the form $$A_1; x:=f_1(\ldots), B_1;$$

$$A_2; x:=f_2(\ldots), B_2;$$

where $A_i$ and $B_i$ are CHP fragments that do not include any assignments to variable x. For all i, $1 \leq i \leq n$, one can rewrite each program part $A_i$; $x:=e_i$, $B_i$ as $$(A_i)_{x \to x_{i-1}}; x_i:=(e_i)_{x \to x_{i-1}}, (B_i)_{x \to x_{i-1}}$$

(The notation $(S)_{a \to b}$ indicates that all instances of a in CHP code S are replaced by b.) The rewritten CHP is functionally equivalent to the original series, but is now in DSA form since each new variable $x_i$ is assigned a value only once. If x has been assigned a value in the CHP prior to this series, then it is assumed that this initial value is stored in the variable $x_0$. The following example demonstrates how a series P may be rewritten in DSA form:

$$P \equiv A?a, B?b; x:=a, y:=b; X!x; C?x; X!x$$

$$P_{DSA} \equiv A?a, B?b; x_1:=a, y:=b; X!x_1; C?x_2; X!x_2.$$

1.5 Selection Statements

Furthermore in step 18 of FIG. 2, as the main input program is converted into DSA form, the present invention handles another commonly found program structure, namely, selection statements. A selection is in DSA form when no branch of control contains more than one assignment to the same variable. Consider a selection containing K assignments to x, with a maximum of N, N<K, such assignments in any guarded command. Instead of creating a new variable for each of the K assignments, the method of the present invention creates N new variables $x_i$, $1 \leq i \leq N$. Then, the ith assignment to x can be replaced with an assignment to $x_i$ in each guarded command. This results in each new variable $x_i$ having at most one assignment in each branch of the selection and therefore being a DSA variable. Within any branch of the selection, assignments to variables $x_i$ still appear in increasing order of i.

The selection is not in DSA form yet though because one issue still remains, that is, the last variable $x_N$ (which will replace x in any CHP that immediately follows the selection statement) may not always be assigned a value. If the kth guarded command contains $n_k$ assignments to x, the version of x that was last assigned a value in the guarded command is $x_{n_k}$. Therefore the following statement is appended to every guarded command for which $n_k$<N: $x_N:=x_{n_k}$. These extra assignments merge the most recent of all branch assignments to x into one variable, $x_N$, that can be used by all CHP immediately after the selection.

As an example, consider the process C below with variables x and y, expressions $e_A$, $e_B$, $e_C$, and guard expressions $g_A$, $g_B$, $g_C$.

$$C \equiv [\ g_A \to x := e_A; A?x$$
$$[]\ g_B \to x := e_B$$
$$[]\ g_C \to y := e_C$$
$$];\ S$$

Variable x has multiple assignments, with a maximum of two assignments in any selection branch. Therefore, it is split into the new variables $x_1$ and $x_2$ following the guidelines given previously. The rewritten process is now $$C_{split} \equiv [\ g_A \to x_1 := e_A; A?x_2$$
$$[]\ g_B \to x_1 := e_B$$
$$[]\ g_C \to y := e_C$$
$$];\ S$$

To convert the $C_{Split}$ into DSA form, it now only remains to, in the cases where $x_2$ is not already assigned a value, assign to it either the value of $x_1$ or an initial value that is called $x_0$. The selection $C_{Split}$, so rewritten, becomes $C_{DSA}$.

$$C_{DSA} \equiv \{\ x_0 = \text{init\_expr}\ \}$$
$$[\ g_A \to x_1 := e_A; A?x_2$$
$$[]\ g_B \to x_1 := e_B; x_2 := x_1$$
$$[]\ g_C \to y := e_C, x_2 := x_0$$
$$];\ (S)_{x \to x2}$$

Now $x_2$ can be used in the code after $C_{DSA}$, and the selection is in DSA form.

2 Projection

After the input source process has been converted to DSA form, the task of breaking it into smaller target processes can begin. Ideally, these new processes are each small enough to be easily compiled into HSE. Often, the hardest aspect of decomposition is deciding which parts of a large process should be separated from each other.

While the basic units of decomposition are variable assignments, the basic tool is the method of projection. Projection is a decomposition technique in which a CHP process is syntactically projected onto disjoint sets of its communication channels and variables. The resulting "images" are the new processes that together form a system which is functionally equivalent to the source process. For example, the process $$*[A?a, B?b; X!a, Y!b]$$

projected onto the sets $$\{A?, a, X!\}\ \text{and}\ \{B?, b, Y!\}$$

results in the new system $$*[A?a; X!a] \| *[B?b; Y!b].$$

Note that the new system is only equivalent to the original process if that process is slack elastic, a requirement that will be further detailed. A few other requirements are enumerated below:

- No Multiple Use of Channels. Programs that use an input or output channel more than once in a main loop iteration form a special case for graphical decomposition, and are not dealt with here.
- No Nested Loops. Programs with this construct form a special case for graphical decomposition, and are not dealt with yet.
- Open System. A closed system usually contains state variables. When these are removed from the program, input and output statements result, turning the system into an open one. In the case where a closed system has no state variables, the decomposition method can still be applied, with the starting points being variable assignments instead of output statements.

The correctness of projection has been proven under the assumption of slack elasticity. However, currently projection is only used for the verification of manually produced process decompositions, rather than for their creation. This is because usually the original process must be rewritten before projection can be applied. Splitting a program in two adds intermediate channels to the system. These new channels, along with the copies of variables that are to be sent on them, must be explicitly written into the CHP code before projection. In one sense then, the decomposed solution must be known ahead of time for projection to be applied.

The projection of present invention finds such a solution in advance. Graphical decomposition follows from the DSA form—if each new process computes a value for a single variable, then the data dependency graph that the variables create provides an overall view of the final decomposed system. The edges in the graph indicate the new intermediate channels required for decomposition and, by their presence, also imply the existence of new copies of variables. With such guidelines, a shorthand form of projection can be directly applied to the program without rewriting any lines of code. In short, the variable and edges of each point node comprise a separate projection set from the main program.

Thus, instead of the prior art methods of relying on experience and intuition in choosing which variables belong in what projection set, the decomposition method of the present invention directs the contents of the projection sets by specifying that each set should contain the variables and channels required to implement the assignments to a particular DSA variable.

As such, the projection set of a variable x contains: (1) the variables and input channels on whose value the assignment to x depends; (2) the output channels on which x is sent; (3) the intermediate channels created by decomposition for communication between the new target processes.

2.1 Slack Elasticity

Projection can only be applied to decompose a process if that process is slack elastic. The slack of a communication channel specifies the maximum number of outstanding messages allowed (the amount of buffering) on that channel. A process is slack elastic if its correctness is preserved when the slack on its channels is increased. Concurrency can be therefore be added to slack elastic processes by pipelining the computation. For example, the process *[L?a; b:=f (a); R!g (b)] remains correct when decomposed into the system *[L?a; X!f (a)]||*[X?b; R!g(b)]. To other processes, the slack of L or of R has increased by one, but the computation from the original process remains the same. The process is therefore slack elastic. Processes that are deterministic (in which the guards of selection statements are mutually exclusive) are necessarily slack elastic.

2.2 Projection Sets

Figure 3:
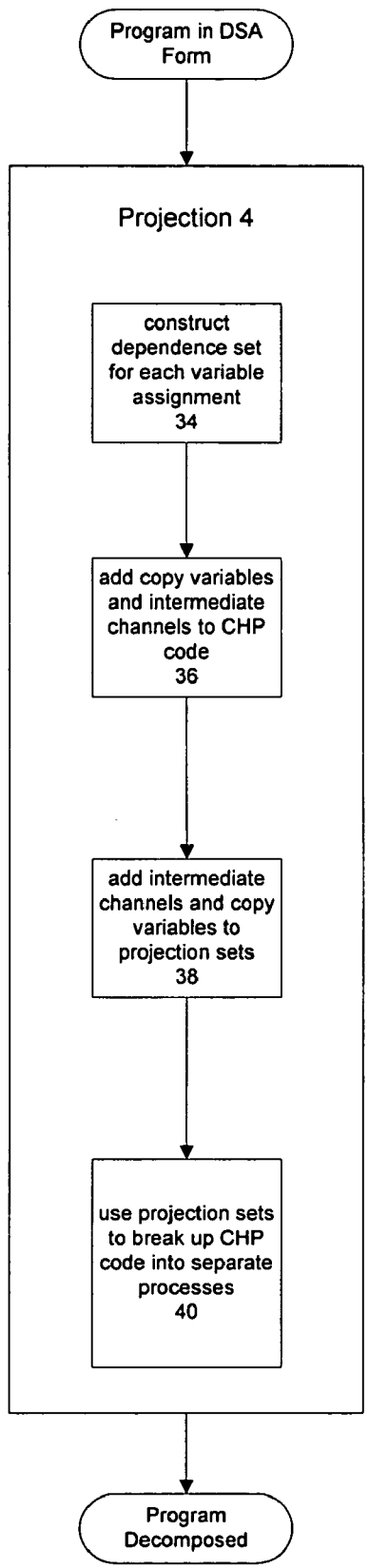
FIG. 3 outlines the projection process according to an embodiment of the present invention.

FIG. 3 shows how projection proceeds and how projection sets are constructed. First, a dependence set is created for each variable assignment in the input program in DSA form (Step 34). If a target process is implementing an assignment to the variable x, then any variable that appears in the function assigned to x belongs in the dependence set. For example, if the assignment is x:=a∧b∨c, then variables a, b, and c all belong in the dependence set for x. If the assignment is the communication A?x, then the input channel A? is a member of the dependence set of x. If the assignment is conditional, then the variables that appear in the guard expressions for the assignment also appear in the dependence set.

Thus, given the selection statement $$[\ a \to x := d$$
$$[]\ b \to X?x$$
$$[]\ \neg(a \vee b) \wedge c \to y\downarrow$$
$$[]\ \neg(a \vee b) \wedge \neg c \to y\uparrow$$
$$],$$

the dependence sets for x and y are as follows:

$$DS(x) = \{a, b, d, X?\}, DS(y) = \{a, b, c\}.$$

When the variable dependence sets have been formed for each assignment in the source process, the number of copies of each variable will be required in the decomposed system is known. In the previous example, two copies are required of both a and b. It follows that new channels will be needed to transfer the values of these copies of a and b. These channels are referred to as intermediate channels and are added so that the target processes can communicate with each other in the decomposed system (step 36 of FIG. 3). These intermediate channels are named according to a simple naming scheme, which is a concatenation the names of the two variables in question. Thus, if a belongs in the dependence set of x, then intermediate channel $A_x$ is responsible for sending the value of a to the target process of x. $A_x$! is therefore added to the projection set of a, while $A_x$? is added to the projection set for x (step 38). Copies of a and b must also be created to send to the target processes for x and y. Using a similar naming convention as for intermediate channels, these new copy variables are named $a_x$, $a_y$, $b_x$, and $b_y$. The projection sets for x and y are now: $PS(x) \equiv \{a_x, A_x?, b_x, B_x?, d, X?\}$, $PS(y) \equiv \{a_y, A_Y?, b_y, B_y?, c_y\}$.

2.3 Copy Variables and Channels

In step 36, the copy variables and channels are incorporated within the CHP code that is being projected. First, statements that assign the proper values to these copy variables are added. Then, the assignment statements are converted into an equivalent pair of communications using the corresponding intermediate channel. For example, the copy assignment $a_x := a$ is rewritten as $(A_x!a || A_x?a_x)$ (where $A_x$! is already in the projection set for a, and $A_x$? is in the projection set for x). The version of a that appears in the assignment to x is then replaced by $a_x$.

This replacement is straightforward if a appears on the RHS of the assignment to x. However, if the assignment to x is conditional and a appears in its guard expression, then the replacement can be more complicated. In general, if an assignment appears in a selection of the form $$[\ g(a) \to x := b, y := c\ []\ else \to ...\ ]$$

and copy variables $a_x$ and $a_y$ have been created, then the selection is rewritten as $$[\ g(a_x) \wedge g(a_y) \to x := b, y := c$$
$$[]\ else \to ...$$
$$]$$

where the value of a has previously been assigned to $a_x$ and $a_y$.

2.4 Breaking Up into Processes

In step 38, projection sets are created to match the added copy variables and intermediate channels. With the sets in place, a final step 40 is performed in projection to break the CHP code into separate processes. The entire mechanisms of projection are illustrated further by the following example process P:

$$*[A?a; b := \neg a; [\, b \rightarrow x\uparrow \,[]\, \neg b \rightarrow B!b\,]]$$

Through the construction the dependecne sets (Step 34), it is known that variable b appears in the dependence sets of both x and B!. Therefore copy variables $b_x$ and $b_B$, and intermediate channels $B_x$ and $B_B$ are created (Step 36). The CHP is changed to incorporate them, but remains functionally equivalent. First, the copy variables are introduced:

$$*[\, A?a;\ b := \neg a;\ b_x := b,\ b_B := b;$$
$$b_x \wedge b_B \rightarrow x\uparrow\ []\ \neg b_x \wedge \neg b_B \rightarrow B!b_B$$
$$]$$

Then, the copy assignments are rewritten as pairs of communication statements:

$$*[\, A?a;\ b := \neg a;$$
$$(B_x!b || B_x?b_x),\ (B_B!b || B_B?b_B);$$
$$[b_x \wedge b_B \rightarrow x\uparrow\ []\ \neg b_x \wedge \neg b_B \rightarrow B!b_B]$$
$$]$$

The assignments to b, x, B! are projected out onto their own processes at step 40. The designate projection sets are $PS(b) \equiv \{A?, a, b, B_x!, B_B!\}$, $PS(X) \equiv \{b_x, B_x?, x\}$, and $PS(B!) \equiv \{b_B, B_B?, B!\}$. The new decomposed system is $Pb \equiv P_{\{A?, a, b, B_x!, B_B!\}} \equiv$
  $*[\, A?a;\ b := \neg a;\ B_x!b,\ B_B!b\ ]$
$Px \equiv P_{\{b_x, B_x?, x\}} \equiv$
  $*[\, B_x?b_x;\ [b_x \rightarrow x\uparrow\ []\ \neg b_x \rightarrow \text{skip}]]$
$PB \equiv P_{\{b_B, B_B!, B!\}} \equiv$
  $*[\, B_B?b_B; [b_B \rightarrow \text{skip}\ []\ \neg b_B \rightarrow B!b_B]]$

2.5 Adding Copy Processes and Eliminating Simple Buffers

In order to keep target processes—as well as any future recomposition or clustering of these processes—as simple as possible, the number of output channels in each target process is limited to one. Thus, if the value of a variable x is required by multiple other target processes, the process for x is given a single output and is then appended a copy process. For example, the process $P_b$ from the previous section becomes $*[A?a; B_{cp}!(\neg a)] || *[B_{cp}?b; B_x!b, B_B!b]$. On an opposite note, target processes which are simple buffers are never created. This is accomplished by not creating individual projection sets for communication statements (assignments) that are not enclosed in a selection statement. Consider the code $*[A?a; x := f(a); X!x]$. There are three assignments in this process and if each were decomposed into its own process, the system $*[A?a; A_x!a] || *[A_x?a; x := f(a); X_x!x] || *[X_x?x; X!_x]$ would result. Under slack elasticity, the new system is identical to the original one: in this case the decomposition does not simplify the system. Therefore target processes are not created for communication assignments unless they appear within a selection statement, in which case their target processes would be more complex than a simple buffer.

2.6 Projection Algorithm

An algorithm embodiment for process decomposition by way of projection is presented below. The algorithm is based on the implementation of the steps from FIG. 3. More specifically, it works from a definition of a value point of a variable, which collects all of the assignments to a signle variable (after DSA conversion) in the CHP code. Input communications are considered assignments to the input variable; the value point of an output channel consists only of output communications. Only variables and input channels can be input arguments for value points.

The decomposition algorithm repeatedly chooses an output channel from the main program and, by projection, creates a process to compute the channel's value point. In the end, every value point in the original program has its own node process. Splitting off a process creates new outputs from the main program. Since once a value point node is created by a function, it calls itself again to create a node for the value point of one of its input arguments, this is a recursive algorithm. The recursion is complete when the main program consists of a single value point. The listing of the function is presented below:

Listing 1

```
DRAW_NODE( var, target ) {
    Create a new node, "var_node", for this variable.
    Draw an edge from this node to the target.
    Get argument list for value point of this variable.
    For each argument in the list {
        If a node for the argument already exists, then
            Draw an edge from the argument node to this node
        Else, if the argument is an input channel, then
            Draw an edge from the input channel to this node
        Else
            /*** Recursive Call ***/
            DRAW_NODE( arg, var_node )
    } }
```

In practise, applying formal projection repeatedly to CHP programs can be complicated and time-consuming. Every time a new process is created, the main CHP program must also be rewritten. If the algorithm is recursive with no global view of the program, it is difficult knowing when to include the original main program variable in a projection set, and when to create a new variable copy. To overcome this obstacle, the decomposition algorithm is broken into two stages.

The first stage decomposes the program into a graph. Each node in the graph represents a value point. Specifically, each node represents the CHP process that computes one of the program's value points. Meanwhile, each edge represents a communication channel between node processes. A graph edge is directed: its source node represents the process that sends the variable out; its target node is the process that reads the variable in.

The graph is drawn one node at a time, beginning with the value points of the original program's output channels, and continuing backwards to the input channels. When a node with input and output edges is created, it is the equivalent of outlining the communication channels of a new process and indicating which value point that process will compute. Conceptually, this is exactly the recursive projection method described in in the previous section. The only difference is the representation of the state of decomposition. Instead of explicitly writing the new CHP code for each state, the graph stores all of the information necessary to write the complete decomposition at the end of recursion, when every value point has been given a node.

Writing the CHP for the node processes is the second stage of this decomposition, and it does not begin until the graph is complete. By this time, all of the internal communications in the decomposed system are established, and this global information is available in the readily accessible graph structure. Since the number of new channels and copies of a variable required given by the graph, the exact CHP can in fact be easily written for each node. The projection of copy processes from nodes with multiple output edges is the only rewriting of CHP required. The complete algorithm for the graphical decomposition of CHP programs is presented below:

Listing 2

```
DECOMPOSITION ALGORITHM =
   Create value points for every
   variable and output channel in the program.
   For every output channel
      /*** Recursively create the graph ***/
      DRAW_NODE( output channel, outside world )
   For every node in the graph {
      By projection, write the CHP process for the node.
      N = Number of output edges for the node
      If N > 1 then
         Project out a copy process from the node.
   } }
```

The recursive function that forms the basis of this graphical method is given in Listing 1. The main algorithm given in the Listing 2 above creates a list of all value points and calls the recursive function once for each output channel in the program. When the recursion ends, a CHP process is written for each node. Nodes with multiple outputs are then split into a functional node and a copy node. Counterbalancing this, simple internal buffer nodes that arise from the algorithm can be eliminated, merging their input and output channels into one.

3 Energy Efficiency

In VLSI design, reducing the number of communications in a system can greatly reduce the energy consumption. Of course, the specification of the original sequential program cannot be changed, and so the communications on external channels must remain the same. However, communications on internal channels introduced by process decomposition can be made conditional. This may decrease energy consumption in three ways: by reducing the wire load that is switched per cycle; by making entire modules conditional; by decreasing the actual number of channels in the system.

The first way is obvious. In the second way, if all of the input and output communications of a module only occur under a certain condition, then the module can stop computing the condition and simply perform the main computation when its data inputs all arrive. For example, the program *[G?g; [g→X?x; Y!(x+1) □ ¬g→skip] can be simply rewritten as *[X?x; Y!(x+1)], since x will only be sent when a computation is required any ways. Finally, the above transformation is also an example of the third way, as the channel G? has been eliminated from the decomposed system, along with its validity-check circuitry.

3.1 Creating Conditional Communications

One embodiment of the present invention can set up sequential programs so that DDD can create conditional communications without introducing overhead. This is shown as step 42 of FIG. 4, where additional steps in DSA conversion are outlined. Consider:

$$COND \equiv *[\ G?g, A?x; Y!x;\\
[\ g = 0 \rightarrow B?b; x := f_1(x,b); C?c; x := f_2(x,c)\\
[]\ g = 1 \rightarrow B?b; W!b\\
[]\ g = 2 \rightarrow skip\\
];\ Z!x\\
]$$

First, when rewriting the program in DSA form, if a variable x is split within a selection statement into multiple DSA variables $x_i$, then only the last of these variables actually needs to have a defined value at the end of the selection. Intermediate DSA variables can be undefined in guarded commands where they are not required.

The DSA version of COND is therefore $$COND_{DSA} \equiv *[\ G?g, A?x_0; Y!x_0;\\
[g = 0 \rightarrow B?b; x_1 := f_1(x_0,b); C?c; x_2 := f_2(x_1,c)\\
[]g = 1 \rightarrow B?b; W!b,\ x_2 := x_0\\
[]g = 2 \rightarrow x_2 := x_0\\
];\ Z!x_2\\
]$$

Variable $x_2$ is used outside of the selection statement and therefore must always be assigned a value. Intermediate DSA variable $x_1$ is only required in the first branch, however, and so is undefined in the other two branches. Now after applying projection in the normal fashion, the process implementing variable $x_1$ is $$Px1 \equiv *[\ Gx1?g, X0x1?x_0;\\
[g = 0 \rightarrow Bx1?b;\ X1x2!f_1(x_0,b)\ []\ else \rightarrow skip]\ ]$$

Communications have been eliminated on intermediate channel X1x2 when g≠0 with no overhead cost—even if X1x2 were to remain unconditional, guard variable g would be required in both processes Px1 and Px2.

The next task is to ensure that defined values of variables are sent only when they are actually used in the receiving module's computation. To illustrate, note that in $COND_{DSA}$ both $x_1$ and W! depend upon b. However, $x_1$ is only assigned a value when g=0 and W!b is only executed when g=1. Therefore, place the projection assignments for intermediate channels Bx1 and BW as follows:

$$*[\ G?g, A?x_0; Y!x_0;\\
[\ g = 0 \rightarrow B?b;\ (Bx1!b||Bx1?b_{x1});\\
\quad x_1 := f_1(x_0,b_{x1});\ C?c;\ x_2 := f_2(x_1,c)\\
[]\ g = 1 \rightarrow B?b; (BW!b||BW?b_w);\ W!b_w, x_2 := x_0\\
[]\ g = 2 \rightarrow x_2 := x_0\\
];\ Z!x_2\\
]$$

After projection, the process implementing assignments to variable b is

```
Pb ≡ *[ Gb?g;
       [ g = 0 → B?b; Bx1!b
       [] g = 1 → B?b; BW!b
       [] g = 2 → skip
       ]]
```

3.2 Encoding Guards

Figure 4:
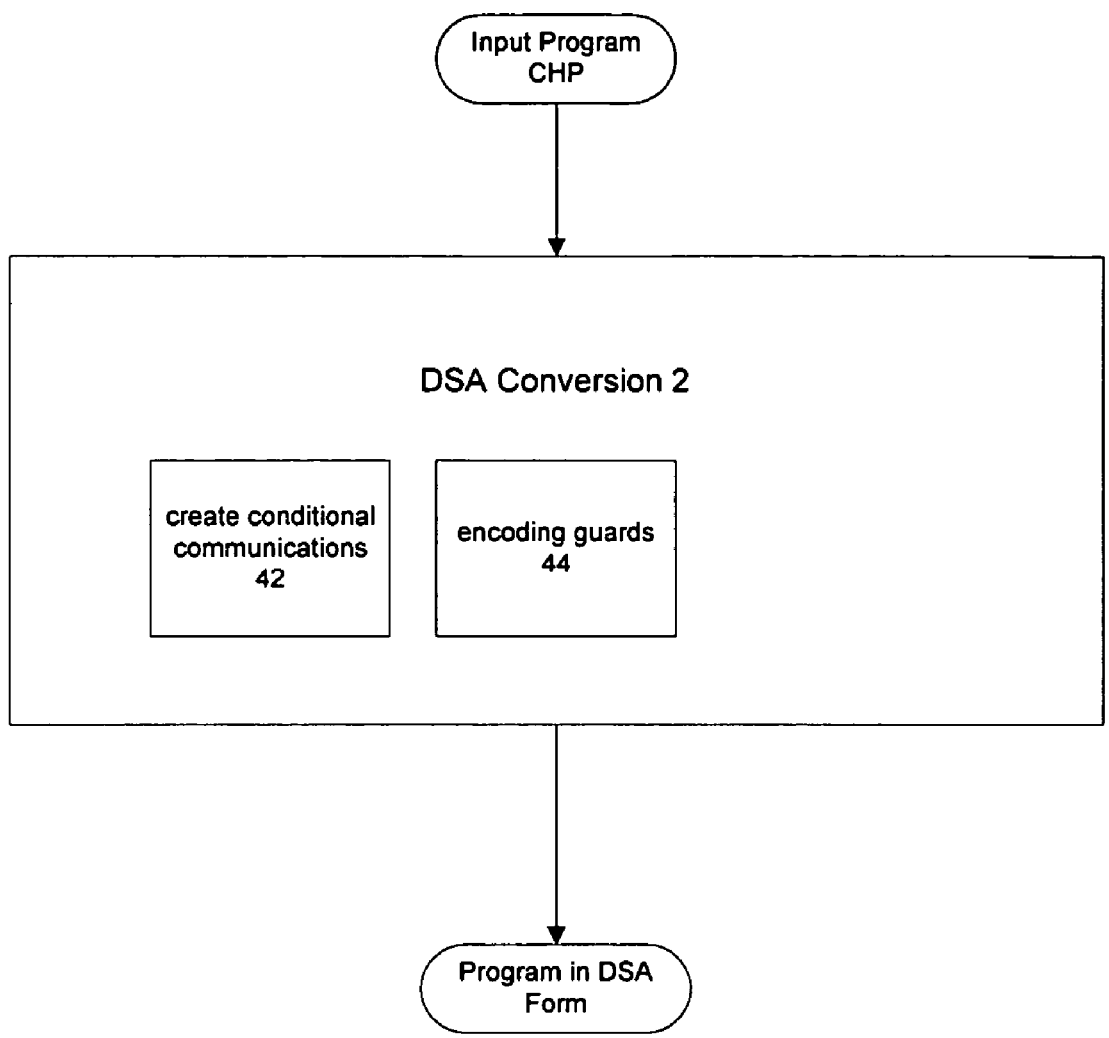
FIG. 4 shows addition a steps that can be performed in DSA conversion.

As shown in step 42 of FIG. 4, another energy efficiency technique encodes guard conditions (branch conditions of selection statements) in fewer variables. The purpose of the transformation is to reduce the number and size of physical channels required in the decomposed system, given that every variable assigned a value within a selection statement depends upon the variables in guard conditions. For example, consider the following process.

```
ENCex ≡ *[ G₀?g₀, G₁?g₁, G₂?g₂, G₃?g₃; A?a, B?b, C?c;
           [ f(g₀,g₁,g₂,g₃) → X!(a ∧b), Y!(b ∧c), z := a ∧c
           [] ¬f(g₀,g₁,g₂,g₃) → z := b ∨c
           ]; Z!(a ∨z)
         ]
```

If the guard conditions were encoded as follows:

```
*[ G₀?g₀, G₁?g₁, G₂?g₂, G₃?g₃; A?a, B?b, C?c;
   h := f(g₀,g₁,g₂,g₃);
   [ h → X!(a ∧b), Y!(b ∧c), z := a ∧c
   [] ¬h → z := b ∨c
   ]; Z!(a ∨z)
 ]
``` the number of channels would depend on the size of the variables $g_i$, the number of variables assigned a value in the selection (three), and the number of guarded commands in the selection statement (two).

To begin, encode guards by assigning a communications cost to every variable in the sequential code. A variable that can hold K different values can be communicated on a 1 of K internal channel. (A 1 of K code comprises K data wires encoded in a one-hot style, and a single acknowledge wire.) For practical purposes, break large channels up into a group of channels of manageable size (e.g., 1-byte variables are not communicated on a 1of256 channel but rather upon four 1of4 channels).

Choose some base channel-size 1 of B. Normally, B=4 but any reasonable value (say, B≦8) can be chosen for this purpose. If a variable x can assume K different values, then define V(x)=K. The internal channel required to communicate x can be implemented as $\lceil \log_B K \rceil$ different 1 of B channels. This variable is therefore assigned a communications cost of $C(x) = \lceil \log_B(V(X)) \rceil$.

In summary, scanning through the sequential program then, for every selection statement: let G be the set of all guard variables in the selection; let N be the number of conditions in the selection; let A be the number of variables assigned a value within the selection. Let h be the variable that encodes the guard conditions. Now, compute E (the communications cost when guard conditions are encoded in h), and U (the cost when they are left unencoded). Then:

$$C(G) = \Sigma_{\forall g_i \in G} C(g_i) \quad V(h) = N$$

$$E = C(G) + C(h)*A \quad U = C(G)*A$$

Figure 5:
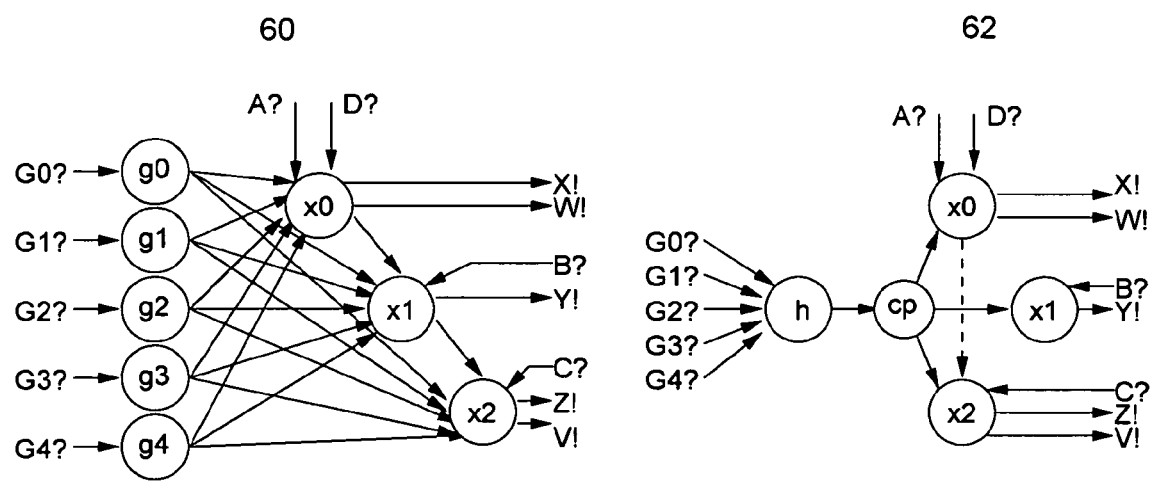
FIG. 5 illustrates an example where possible communications savings are achieved when guards are encoded using the method of the present invention.

If E<U then encode the guard conditions of the selection in question. If not, leave the selection unencoded. The systems in FIG. 5 demonstrate the possible communications savings when guards using $g_i$ are encoded in h using the technique described here.

Returning to the example, N=2 and A=3. Let $V(g_i)$=4 for $\forall g_i \in G$. Then C(G)=4, C(h)=1, U=12, and E=7. In this case, encoding the guard conditions reduces the communications cost of the selection by almost half. In contrast, when V(a)=V(b)=4, the process *[A?a, B?b; [a∧b→x↑ []else→x↓]] is an example of a selection for which it is better not to encode the guard conditions (U=2, E=3).

4 Clustering

The small processes produced by the process of DSA conversion and projection are often good candidates for clustering. Recomposing DDD modules into larger modules further improves energy and performance of the overall system. DDD modules can be clustered together with different goals in mind: reducing energy consumption, reducing forward latency, or reducing the time- and energy-efficiency metric $Et^2$.

Figure 6:
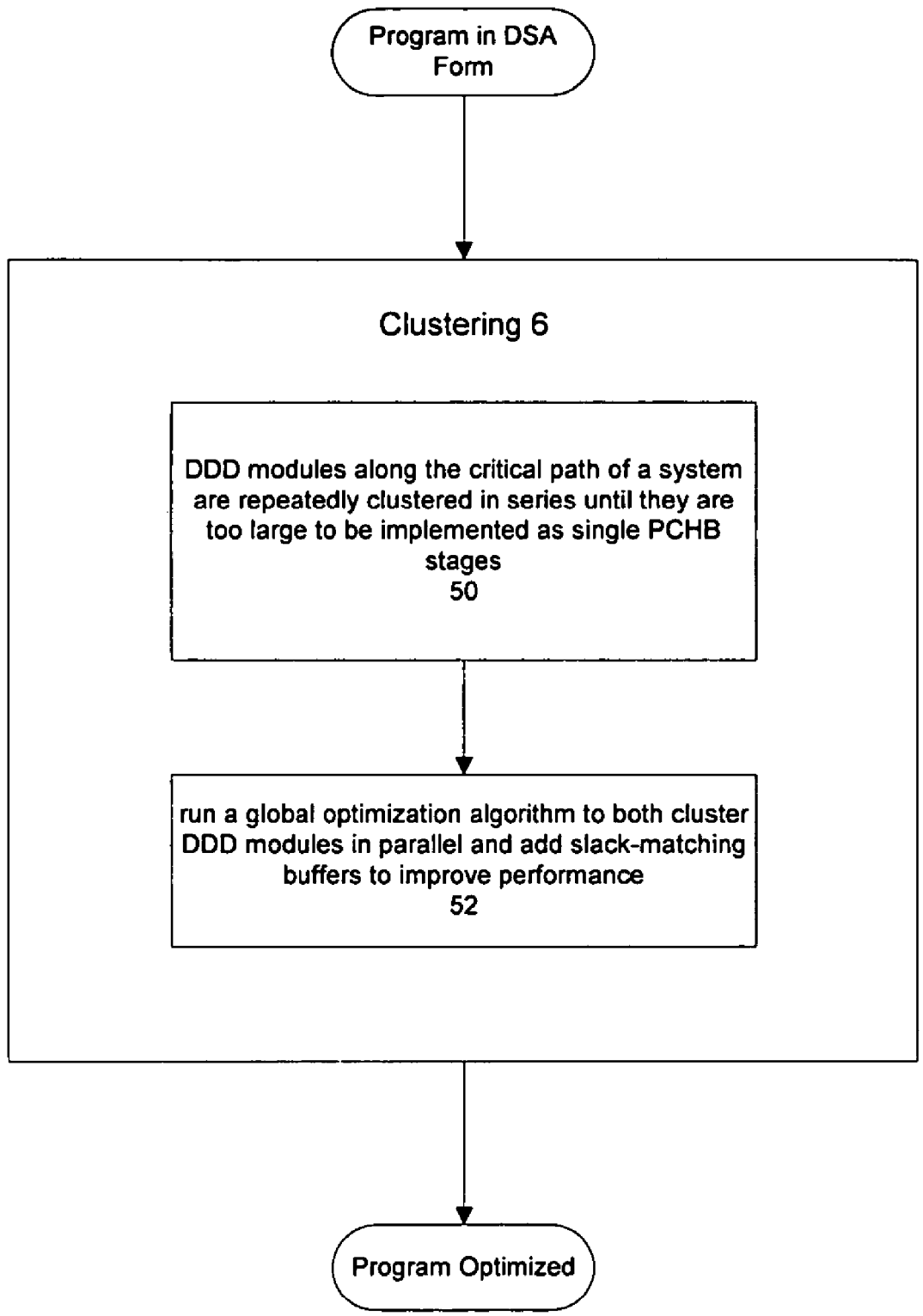
FIG. 6 outlines the clustering process according to an embodiment of the present invention.

Clustering is implemented in two stages, as shown in FIG. 6. In the first stage, 52, DDD modules along the critical path of a system are repeatedly clustered in series until they are too large to be implemented as single pre-charge half buffer (PCHB) stages. The second stage (54) requires a global optimization algorithm (e.g. quadratic programming, simulated annealing, and genetic algorithms) to both cluster DDD modules in parallel and add slack-matching buffers to improve performance.

4.1 Optimal Clustering Amount

The modules produced by DDD are often smaller than necessary, creating concurrent systems with extra communications overhead. To reduce overhead, cluster modules are clustered together into larger CHP processes that still fit into a single PCHB asynchronous pipeline stage. Of course, an entire microprocessor can theoretically be implemented in a single pipeline stage by creating one large state machine. But limits both physical (e.g., the number of transistors in series) and self-imposed (e.g., cycle time) enforce a maximum size for pipeline stages.

It can be determined from the CHP alone whether a clustered module exceeds the maximum limits using the template for PCHB circuits. To check whether there will be too many transistors in series in the pulldown network, one can scrutinize modules with complicated boolean functions. To check if the cluster exceeds the specified cycle time, one can examine modules with many wide communication channels. (Such modules can result in circuits with deep validity-check and completion trees.)

4.2 Clustering DDD Modules in Sequence

Figure 7:
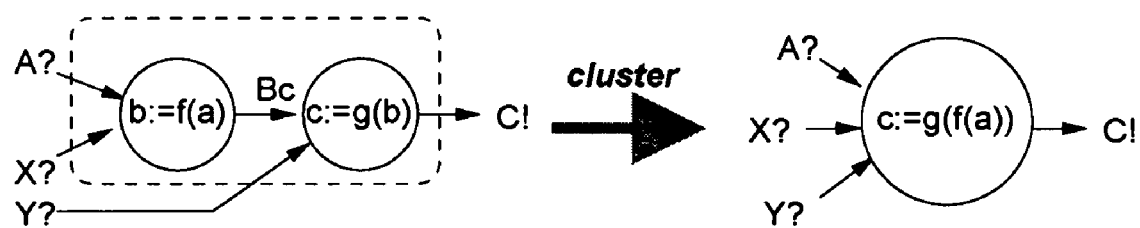
FIG. 7 shows an example where two DDD modules that appear in sequence can be clustered according to an embodiment of the present invention.

If two DDD modules appear in sequence, as shown in FIG. 7, clustering them together may decrease the forward latency of the concurrent system. Their combined computation must first be check to ensure that it is simple enough that it fits into a single stage (i.e., count the transistors in series). Clustering two modules in sequence also reduces overall energy consumption by eliminating the channels (and validity checks) in between them.

The asynchronous systems achieve peak performance when all of the inputs to a module arrive at the same time. This is the motivating principle of "slack-matching," and it dictates that all paths from any primary input (external input channel in the sequential code) to a given module traverse the same number of pipeline stages. Slack-matching therefore helps determine the optimal number of pipeline stages along a path. Previous research shows that the $Et^2$ efficiency of a system is highest when there is an equal amount of power distributed to each pipeline stage. Combining this requirement with the results of slack-matching, it is noted a path that optimally has N pipeline stages is more efficient when all N stages perform some computation than when only two stages perform computation and the other N−2 are simple buffers there simply to add slack.

Therefore the present invention clusters modules together in sequence only if they appear upon the longest path of the decomposed system (i.e., if clustering reduces the forward latency of the system as a whole). There is no point in clustering modules in sequence along shorter paths, since buffers will be added during slack-matching to improve performance anyways. When the forward latency of the system has been decreased, a new iteration is started and the method of the present invention attempts to cluster modules along the new longest path. Only when no new clusters will fit in a single pipeline stage does the method slack-match the system.

Slack-matching is similar to the retiming problem in synchronous circuits, but in the asynchronous design style of the present invention, every module combines computation logic and latching instead of keeping them as separate units. Also, slack-elasticity allows for the adding of buffers (the equivalent of retiming registers) on any channel without worrying about adding an equal number to each input of a combinational logic block to preserve system correctness. Finally, since slack-matching is performed for $Et^2$ efficiency and time is not the only criterion, care must be exercised so as to not over-slack-match systems.

4.3 Clustering DDD Modules in Parallel

Figure 8:
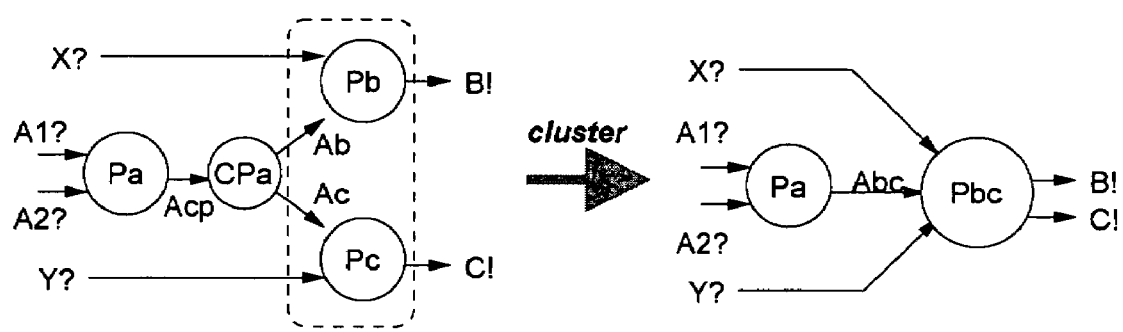
FIG. 8 shows an example where two DDD modules that share the same inputs are clustered.

Clustering modules that operate in parallel reduces energy consumption only when the modules share inputs (when both their computations depend on the same variable). When such modules are merged, their separate input communication channels are collapsed into one. This reduces the number of wires switched per cycle and eliminates the redundant input validity trees that used to grace each module. The two modules Pb and Pc in FIG. 8 illustrate such a scenario.

Slack-matching also plays a role here. When the two modules are combined in parallel, it it desired that all inputs to the new module to arrive at the same time. Therefore the system can be thought of as a table with columns, where all modules in the same column are the same number of pipeline stages away from the primary inputs. For optimal performance, one embodiment of the present invention clusters modules that share inputs when they appear in the same column.

Figure 9:
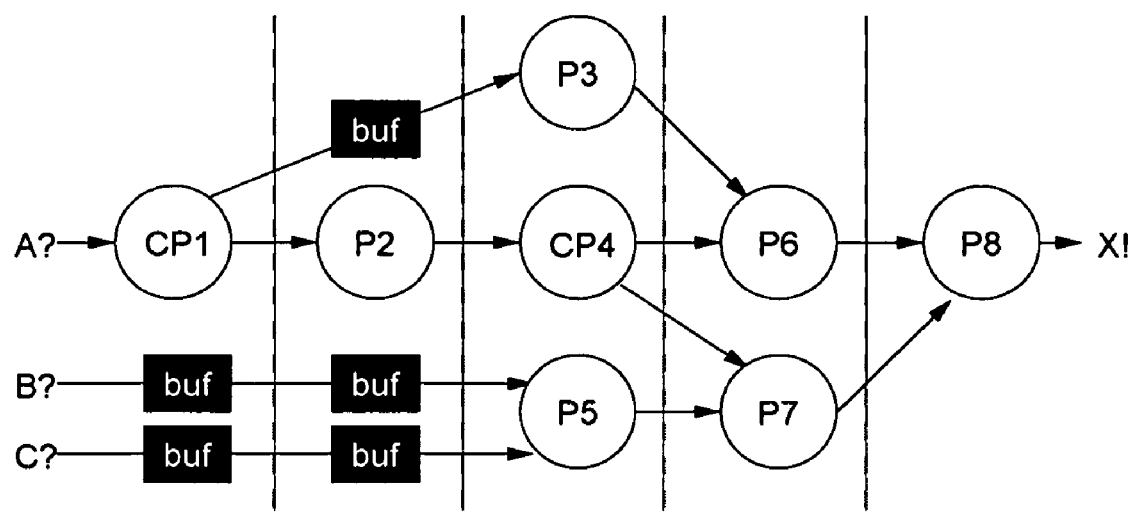
FIG. 9 shows a column view of a slack-matched concurrent system.

On shorter paths that use simple buffers to match the lengths of longer paths, the columns of these buffers are swapped with computation modules so that more computation modules can be clustered together. This is illustrated in FIG. 9, where external channels A?, B? and C? are primary inputs while X! is a primary output. Modules P6 and P7 are in the same column and share inputs from CP4: as such, they can be clustered. Modules P2 and P3 both share inputs from CP1 but are in different columns.

If P3 were swapped with the buffer before it, then it could be clustered with P2. But if the output channel of P3 is much larger than its input channel, the swapping and clustering can increase the overall energy consumption in the system.

It can be seen that the combination of clustering DDD modules and slack-matching for performance is a global optimization problem.

4.4 Clustering Tool

One embodiment of the present invention is a clustering tool that receives as its input a concurrent system of DDD modules, as well as physical limits and desired cycle time of PCHB buffer stages. The tool first loops through clustering DDD modules in sequence until the forward latency can be reduced no further. If energy efficiency is the main goal, a cost function is input such that, when fed to an iterative search algorithm, clusters modules in parallel and finds a system that consumes minimal energy while matching the desired cycle time. The output of the clustering tool is a coarser-grained concurrent system of modules that can still each be implemented as a single asynchronous pipeline stage.

5 Embodiment of Computer Execution Environment (Hardware)

Figure 10:
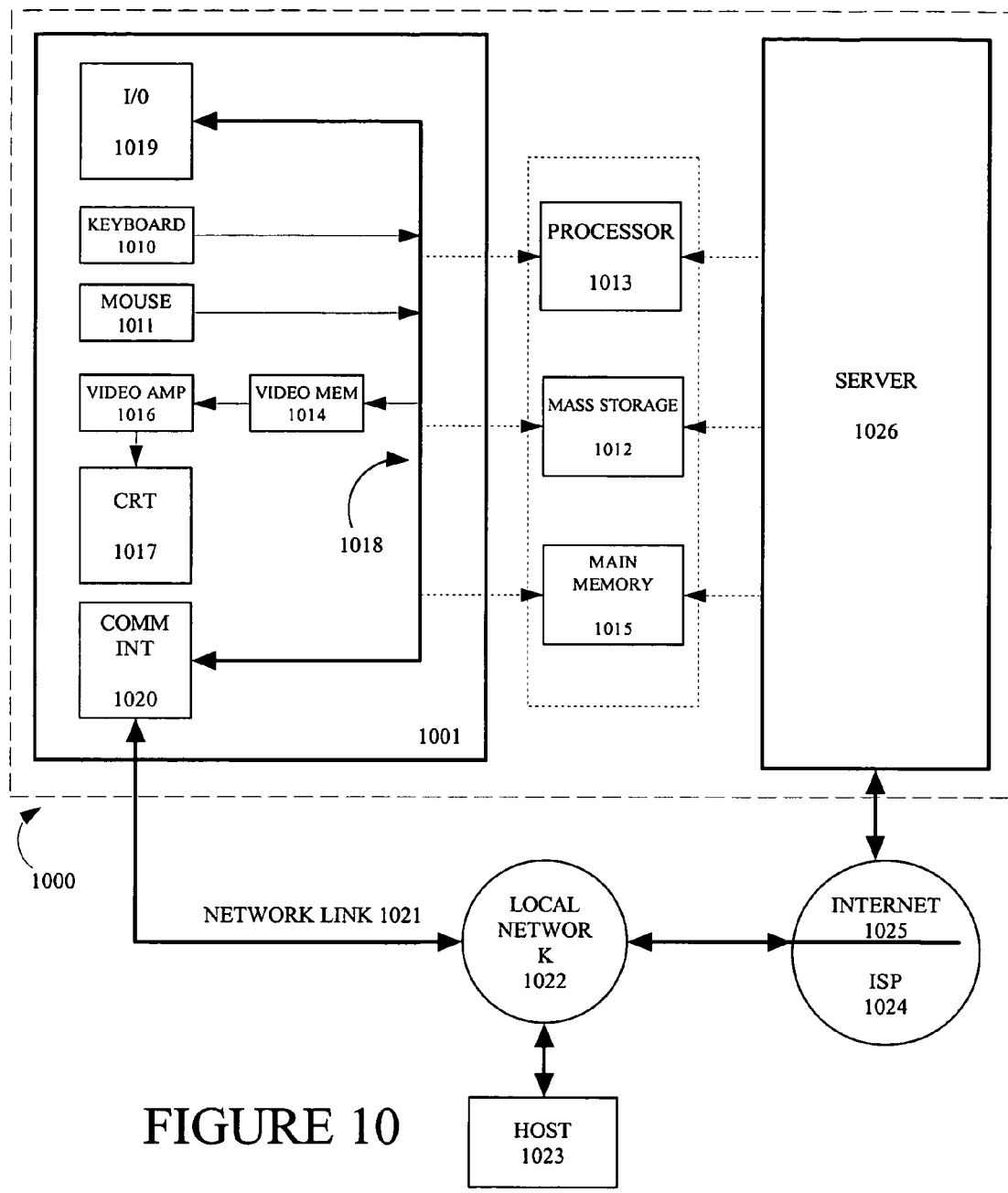
FIG. 10 depicts a general computer embodiment.

One or more embodiments of the present invention that perform data-driven decomposition are implemented in computer software running on a plurality of general purpose computing devices as shown in FIG. 10.

A keyboard 1010 and mouse 1011 are coupled to a system bus 1018. The keyboard and mouse are for introducing user input to the computer system and communicating that user input to central processing unit (CPU) 1013. Other suitable input devices may be used in addition to, or in place of, the mouse 1011 and keyboard 1010. I/O (input/output) unit 1019 coupled to bi-directional system bus 1018 represents such I/O elements as a printer, A/V (audio/video) I/O, etc.

Computer 1001 may include a communication interface 1020 coupled to bus 1018. Communication interface 1020 provides a two-way data communication coupling via a network link 1021 to a local network 1022. For example, if communication interface 1020 is an integrated services digital network (ISDN) card or a modem, communication interface 1020 provides a data communication connection to the corresponding type of telephone line, which comprises part of network link 1021. If communication interface 1020 is a local area network (LAN) card, communication interface 1020 provides a data communication connection via network link 1021 to a compatible LAN. Wireless links are also possible.

In any such implementation, communication interface 1020 sends and receives electrical, electromagnetic or optical signals which carry digital data streams representing various types of information.

Network link 1021 typically provides data communication through one or more networks to other data devices. For example, network link 1021 may provide a connection through local network 1022 to local server computer 1023 or to data equipment operated by ISP 1024. ISP 1024 in turn provides data communication services through the world wide packet data communication network now commonly referred to as the "Internet" 1025. Local network 1022 and Internet 1025 both use electrical, electromagnetic or optical signals which carry digital data streams. The signals through the various networks and the signals on network link 1021 and through communication interface 1020, which carry the digital data to and from computer 1000, are exemplary forms of carrier waves transporting the information.

Processor 1013 may reside wholly on client computer 1001 or wholly on server 1026 or processor 1013 may have its computational power distributed between computer 1001 and server 1026. Server 1026 symbolically is represented in FIG. 10 as one unit, but server 1026 can also be distributed between multiple "tiers". In one embodiment, server 1026 comprises a middle and back tier where application logic executes in the middle tier and persistent data is obtained in the back tier. In the case where processor 1013 resides wholly on server 1026, the results of the computations performed by processor 1013 are transmitted to computer 1001 via Internet 1025, Internet Service Provider (ISP) 1024, local network 1022 and communication interface 1020. In this way, computer 1001 is able to display the results of the computation to a user in the form of output.

Computer 1001 includes a video memory 1014, main memory 1015 and mass storage 1012, all coupled to bi-directional system bus 1018 along with keyboard 1010, mouse 1011 and processor 1013. As with processor 1013, in various computing environments, main memory 1015 and mass storage 1012, can reside wholly on server 1026 or computer 1001, or they may be distributed between the two. Examples of systems where processor 1013, main memory 1015, and mass storage 1012 are distributed between computer 1001 and server 1026 include the thin-client computing architecture, personal digital assistants, Internet ready cellular phones and other Internet computing devices.

The mass storage 1012 may include both fixed and removable media, such as magnetic, optical or magnetic optical storage systems or any other available mass storage technology. Bus 1018 may contain, for example, thirty-two address lines for addressing video memory 1014 or main memory 1015. The system bus 1018 also includes, for example, a 32-bit data bus for transferring data between and among the components, such as processor 1013, main memory 1015, video memory 1014 and mass storage 1012. Alternatively, multiplex data/address lines may be used instead of separate data and address lines.

In one embodiment of the invention, the processor 1013 can be any suitable microprocessor or microcomputer. Main memory 1015 is comprised of dynamic random access memory (DRAM) or other equivalent memory types. Video memory 1014 is a dual-ported video random access memory. One port of the video memory 1014 is coupled to video amplifier 1016. The video amplifier 1016 is used to drive the cathode ray tube (CRT) raster monitor 1017. Video amplifier 1016 is well known in the art and may be implemented by any suitable apparatus. This circuitry converts pixel data stored in video memory 1014 to a raster signal suitable for use by monitor 1017. Monitor 1017 is a type of monitor suitable for displaying graphic images.

Computer 1001 can send messages and receive data, including program code, through the network(s), network link 1021, and communication interface 1020. In the Internet example, remote server computer 1026 might transmit a requested code for an application program through Internet 1025, ISP 1024, local network 1022 and communication interface 1020. The received code may be executed by processor 1013 as it is received, and/or stored in mass storage 1012, or other non-volatile storage for later execution. In this manner, computer 1000 may obtain application code in the form of a carrier wave. Alternatively, remote server computer 1026 may execute applications using processor 1013, and utilize mass storage 1012, and/or video memory 1015. The results of the execution at server 1026 are then transmitted through Internet 1025, ISP 1024, local network 1022 and communication interface 1020. In this example, computer 1001 performs only input and output functions.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

The computer systems described above are for purposes of example only. An embodiment of the invention may be implemented in any type of computer system or programming or processing environment.

Thus, a method for the synthesis of VLSI systems based on data-driven decomposition is described in conjunction with one or more specific embodiments. The invention is defined by the following claims and their full scope of equivalents.

We claim:

1. A method for a data-driven decomposition based synthesis of VLSI systems, comprising:
   converting an input circuit program into an intermediate Dynamic Single Assignment (DSA) form;
   performing a projection process to decompose said intermediate DSA into smaller concurrent process modules; and
   clustering said concurrent process modules whereby small concurrent process modules are optimally grouped to produce a final decomposition.

2. The method of claim 1 wherein said converting further comprises:
   removing initial actions from said input program whereby initial actions are rewritten into the main loop of said input program; and
   removing state variables from said input program whereby new buffers are created to replace state variables in said input program.

3. The method of claim 1 wherein said converting further comprises:
   extracting arrays in said input program into separate processes.

4. The method of claim 1 wherein said converting further comprises:
   handling multiple assignments to variables in said input program, whereby multiple assignments to a variable are converted to assignments to a series of new variables.

5. The method of claim 1 wherein said series of new variables are index-numbered, according to order of appearance in said input program.

6. The method of claim 1 wherein said converting further comprises:
   handling straightline programs in said input program, whereby multiple assignments in a straight line series in said input program are rewritten into assignments to a series of new variables; and
   handling selection statements in said input program, whereby multiple assignments in the guarded commands in said input program are rewritten into assignments to a series of new variables.

7. The method of claim 1 wherein said performing a projection process further comprises:
   constructing a plurality of dependence sets, wherein a dependence set is created for each variable assignment in said intermediate DSA;
   adding a plurality of copy variables and intermediate channels to said input program;
   adding said copy variables and intermediate channels to a plurality of projection sets, wherein said projection sets are based on said dependence sets;
   using said projection sets to decompose code in said program into separate process modules.

8. The method of claim 1 wherein said converting further comprises:

creating conditional communications in said input program.

9. The method of claim 1 wherein said converting further comprises:
encoding guards in said input program.

10. The method of claim 1 wherein said clustering comprises:
repeatedly clustering said modules along the critical path of the system of said program in series until said modules are too large to be implemented as single pre-charge half-buffer (PCHB) stages;
running a global optimization algorithm to both cluster said modules in parallel and add slack-matching buffers.

11. The method of claim 10 wherein said repeatedly clustering comprises:
using a plurality criteria to determine the upper limit of the number of modules clustered.

12. The method of claim 10 wherein said repeatedly clustering comprises:
clustering modules in sequence.

13. The method of claim 10 wherein said repeatedly clustering comprises:
clustering modules in parallel.

14. A computer program product comprising:
a computer usable medium having computer readable program code embodied therein configured to perform data-driven decomposition for the synthesis of VLSI systems, said computer program product comprising:
computer readable code configured to cause a computer to convert an input circuit program into an intermediate Dynamic Single Assignment (DSA) form;
computer readable code configured to cause a computer to perform a projection process to decompose said intermediate DSA into smaller concurrent process modules; and
computer readable code configured to cause a computer to cluster said concurrent process modules whereby small concurrent process modules are optimally grouped to produce a final decomposition.

15. The computer program product of claim 14 wherein said computer readable code configured to cause a computer to convert further comprises:
computer readable code configured to cause a computer to remove initial actions from said input program whereby initial actions are rewritten into the main loop of said input program; and
computer readable code configured to cause a computer to remove state variables from said input program whereby new buffers are created to replace state variables in said input program.

16. The computer program product of claim 14 wherein said computer readable code configured to cause a computer to convert further comprises:
computer readable code configured to cause a computer to extract arrays in said input program into separate processes.

17. The computer program product of claim 14 wherein said computer readable code configured to cause a computer to convert further comprises:
computer readable code configured to cause a computer to handle multiple assignments to variables in said input program, whereby multiple assignments to a variable are converted to assignments to a series of new variables.

18. The computer program product of claim 17 wherein said series of new variables are index-numbered according to order of appearance in said input program.

19. The computer program product of claim 14 wherein said computer readable code configured to cause a computer to convert further comprises:
computer readable code configured to cause a computer to handle straightline programs in said input program, whereby multiple assignments in a straight line series in said input program are rewritten into assignments to a series of new variables; and
computer readable code configured to cause a computer to handle selection statements in said input program, whereby multiple assignments in the guarded commands in said input program are rewritten into assignments to a series of new variables.

20. The computer program product of claim 14 wherein said computer readable code configured to cause a computer to perform a projection process further comprises:
computer readable code configured to cause a computer to construct a plurality of dependence sets, wherein a dependence set is created for each variable assignment in said intermediate DSA;
computer readable code configured to cause a computer to add a plurality of copy variables and intermediate channels to said input program;
computer readable code configured to cause a computer to add said copy variables and intermediate channels to plurality of projection sets, wherein said projection sets are based on said dependence sets;
computer readable code configured to cause a computer to use said projection sets to decompose code in said program into separate process modules.

21. The computer program product of claim 14 wherein said computer readable code configured to cause a computer to convert further comprises:
computer readable code configured to cause a computer to create conditional communications in said input program.

22. The computer program product of claim 14 wherein said computer readable code configured to cause a computer to convert further comprises:
computer readable code configured to cause a computer to encode guards in said input program.

23. The computer program product of claim 14 wherein said computer readable code configured to cause a computer to cluster further comprises:
computer readable code configured to cause a computer to repeatedly cluster said modules along the critical path of the system of said program in series until said modules are too large to be implemented as single pre-charge half-buffer (PCHB) stages;
computer readable code configured to cause a computer to run a global optimization algorithm to both cluster said modules in parallel and add slack-matching buffers.

24. The computer program product of claim 23 wherein said computer readable code configured to cause a computer to repeatedly cluster further comprises:
computer readable code configured to cause a computer to use a plurality criteria to determine the upper limit of the number of modules clustered.

25. The computer program product of claim 23 wherein said computer readable code configured to cause a computer to repeatedly cluster further comprises:
computer readable code configured to cause a computer to cluster modules in sequence.

26. The computer program product of claim 23 wherein said computer readable code configured to cause a computer to repeatedly cluster further comprises: computer readable code configured to cause a computer to cluster modules in parallel.

27. An apparatus for a data-driven decomposition for the synthesis of VLSI systems, comprising:
- a converter component for converting an input circuit program into an intermediate Dynamic Single Assignment (DSA) form;
- a projection component for decomposing said intermediate DSA into smaller concurrent process modules; and
- a clustering component for clustering said concurrent process modules whereby small concurrent process modules are optimally grouped to produce a final decomposition.

28. The apparatus of claim 27 wherein said converter component further comprises:
- an analytical component for removing initial actions from said input program whereby initial actions are rewritten into the main loop of said input program and removing state variables from said input program whereby new buffers are created to replace state variables in said input program.

29. The apparatus of claim 27 wherein said converter component further comprises:
- an analytical component for extracting arrays in said input program into separate processes.

30. The apparatus of claim 27 wherein said converter component further comprises:
- an analytical component for handling multiple assignments to variables in said input program, whereby multiple assignments to a variable are converted to assignments to a series of new variables.

31. The apparatus of claim 30 wherein said series of new variables are index-numbered according to order of appearance in said input program.

32. The apparatus of claim 27 wherein said converter component further comprises:
- an analytical component for handling straightline programs in said input program, whereby multiple assignments in a straight line series in said input programs are rewritten into assignments to a series of new variables and for handling selection statements in said input program, whereby multiple assignments in the guarded commands in said input program are rewritten into assignments to a series of new variables.

33. The apparatus of claim 27 wherein said projection component further comprises:
- a construction unit for constructing a plurality of dependence sets, wherein a dependence set is created for each variable assignment in said intermediate DSA; a first adding unit for adding a plurality of copy variables and intermediate channels to said input program;
- a second adding unit for adding said copy variables and intermediate channels to a plurality of projection sets, wherein said projection sets are based on said dependence sets;
- a decomposition unit for using said projection sets to decompose code in said program into separate process modules.

34. The apparatus of claim 27 wherein said converter component further comprises:
- an analytical component for creating conditional communications in said input program.

35. The apparatus of claim 27 wherein said converter component further comprises:
- an analytical component for encoding guards in said input program.

36. The apparatus of claim 27 wherein said clustering component further comprises:
- a clustering tool for repeatedly clustering said modules along the critical path of the system of said program in series until said modules are too large to be implemented as single pre-charge half-buffer (PCHB) stages.

37. The apparatus of claim 36 wherein said clustering tool uses a plurality criteria to determine the upper limit of the number of modules clustered.

38. The apparatus of claim 36 wherein said clustering tool clusters modules in sequence.

39. The apparatus of claim 36 wherein said clustering tool clusters modules in parallel.

40. A method for a data-driven decomposition based synthesis of VLSI systems, comprising:
- converting an input circuit program into an intermediate Dynamic Single Assignment (DSA) form;
- performing a projection process to decompose said intermediate DSA into smaller concurrent process modules; and
- clustering said concurrent process modules whereby small concurrent process modules are optimally grouped to produce a final decomposition wherein said clustering comprises:
- repeatedly clustering said modules along the critical path of the system of said program in series until said modules are too large to be implemented as single pre-charge half-buffer (PCHB) stages;
- running a global optimization algorithm to both cluster said modules in parallel and add slack-matching buffers.

41. The method of claim 40 wherein said repeatedly clustering comprises:
- using a plurality criteria to determine the upper limit of the number of modules clustered.

42. The method of claim 40 wherein said repeatedly clustering comprises:
- clustering modules in sequence.

43. The method of claim 40 wherein said repeatedly clustering comprises:
- clustering modules in parallel.

44. A computer program product comprising:
- a computer usable medium having computer readable program code embodied therein configured to perform data-driven decomposition for the synthesis of VLSI systems, said computer program product comprising:
- computer readable code configured to cause a computer to convert an input circuit program into an intermediate Dynamic Single Assignment (DSA) form;
- computer readable code configured to cause a computer to perform a projection process to decompose said intermediate DSA into smaller concurrent process modules; and
- computer readable code configured to cause a computer to cluster said concurrent process modules whereby small concurrent process modules are optimally grouped to produce a final decomposition wherein said computer readable code configured to cause a computer to cluster further comprises:
- computer readable code configured to cause a computer to repeatedly cluster said modules along the critical path of the system of said program in series until said modules are too large to be implemented as single pre-charge half-buffer (PCHB) stages;
- computer readable code configured to cause a computer to run a global optimization algorithm to both cluster said modules in parallel and add slack-matching buffers.

45. The computer program product of claim 44 wherein said computer readable code configured to cause a computer to repeatedly cluster further comprises:

computer readable code configured to cause a computer to use a plurality criteria to determine the upper limit of the number of modules clustered.

46. The computer program product of claim 44 wherein said computer readable code configured to cause a computer to repeatedly cluster further comprises:

computer readable code configured to cause a computer to cluster modules in sequence.

47. The computer program product of claim 44 wherein said computer readable code configured to cause a computer to repeatedly cluster further comprises:

computer readable code configured to cause a computer to cluster modules in parallel.

48. An apparatus for a data-driven decomposition for the synthesis of VLSI systems, comprising:

a converter component for converting an input circuit program into an intermediate Dynamic Single Assignment (DSA) form;

a projection component for decomposing said intermediate DSA into smaller concurrent process modules; and a clustering component for clustering said concurrent process modules whereby small concurrent process modules are optimally grouped to produce a final decomposition wherein said clustering component further comprises:

a clustering tool for repeatedly clustering said modules along the critical path of the system of said program in series until said modules are too large to be implemented as single pre-charge half-buffer (PCHB) stages.

49. The apparatus of claim 48 wherein said clustering tool uses a plurality criteria to determine the upper limit of the number of modules clustered.

50. The apparatus of claim 48 wherein said clustering tool clusters modules in sequence.

51. The apparatus of claim 48 wherein said clustering tool clusters modules in parallel.

* * * * *